United States Patent
Partridge et al.

(10) Patent No.: US 7,180,167 B2
(45) Date of Patent: Feb. 20, 2007

(54) LOW PROFILE STACKING SYSTEM AND METHOD

(75) Inventors: Julian Partridge, Austin, TX (US); James W. Cady, Austin, TX (US); James Wilder, Austin, TX (US); David L. Roper, Austin, TX (US); James Douglas Wehrly, Jr., Austin, TX (US)

(73) Assignee: Staktek Group L. P., Austin, TX (US)

( * ) Notice: Subject to any disclaimer, the term of this patent is extended or adjusted under 35 U.S.C. 154(b) by 0 days.

(21) Appl. No.: 11/011,469

(22) Filed: Dec. 14, 2004

(65) Prior Publication Data

US 2005/0146031 A1 Jul. 7, 2005

Related U.S. Application Data

(60) Division of application No. 10/457,608, filed on Jun. 9, 2003, which is a continuation-in-part of application No. 10/005,581, filed on Oct. 26, 2001, now Pat. No. 6,576,992.

(51) Int. Cl.
*H01L 23/02* (2006.01)

(52) U.S. Cl. ............... 257/686; 257/777; 257/723; 438/109; 361/749; 361/789; 361/803

(58) Field of Classification Search ............... 257/686, 257/723, 777, 737–738; 361/749, 735, 790, 361/803, 789; 438/109–110
See application file for complete search history.

(56) References Cited

U.S. PATENT DOCUMENTS 3,411,122 A 11/1968 Schiller et al.

(Continued)

FOREIGN PATENT DOCUMENTS

DE 004215467 A1 11/1992

(Continued)

OTHER PUBLICATIONS

William R. Newberry, Design Techniques for Ball Grid Arrays, Xynetix Design Systems, Inc., Portland, Maine, Published on the Internet.

(Continued)

*Primary Examiner*—Zandra V. Smith
*Assistant Examiner*—Thanh Y. Tran
(74) *Attorney, Agent, or Firm*—Fish & Richardson P.C.; J. Scott Denko

(57) ABSTRACT

The present invention provides a system and method that mounts integrated circuit devices onto substrates and a system and method for employing the method in stacked modules. The contact pads of a packaged integrated circuit device are substantially exposed. A solder paste that includes higher temperature solder paste alloy is applied to a substrate or to the integrated circuit device to be mounted. The integrated circuit device is positioned to contact the contacts of the substrate. Heat is applied to create high temperature joints between the contacts of the substrate and the integrated circuit device resulting in a device-substrate assembly with high temperature joints. The formed joints are less subject to re-melting in subsequent processing steps. The method may be employed in devising stacked module constructions such as those disclosed herein as preferred embodiments in accordance with the invention. Typically, the created joints are low in profile.

10 Claims, 4 Drawing Sheets

U.S. PATENT DOCUMENTS

| | | |
|---|---|---|
| 3,436,604 A | 4/1969 | Hyltin |
| 3,654,394 A | 4/1972 | Gordon |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 3,806,767 A * | 4/1974 | Lehrfeld ..................... 361/803 |
| 3,983,547 A | 9/1976 | Almasi |
| 4,079,511 A | 3/1978 | Grabbe |
| 4,103,318 A | 7/1978 | Schwede |
| 4,288,841 A | 9/1981 | Gogal |
| 4,398,235 A | 8/1983 | Lutz et al. |
| 4,406,508 A | 9/1983 | Sadigh-Behzadi |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisaki et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go, deceased et al. |
| 5,117,282 A | 5/1992 | Salatino |
| 5,122,862 A | 6/1992 | Kajihara et al. |
| 5,138,430 A | 8/1992 | Gow, 3rd et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,311,401 A | 5/1994 | Gates, Jr. et al. |
| 5,313,097 A | 5/1994 | Haj-Ali-Ahmadi et al. |
| 5,343,075 A | 8/1994 | Nishino |
| 5,347,428 A | 9/1994 | Carson et al. |
| 5,357,478 A | 10/1994 | Kikuda et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,394,010 A | 2/1995 | Tazawa et al. |
| 5,394,303 A | 2/1995 | Yamaji |
| 5,397,916 A | 3/1995 | Normington |
| 5,402,006 A | 3/1995 | O'Donley |
| 5,420,751 A | 5/1995 | Burns |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley, III et al. |
| 5,479,318 A | 12/1995 | Burns |
| 5,484,959 A | 1/1996 | Burns |
| 5,493,476 A | 2/1996 | Burns |
| 5,499,160 A | 3/1996 | Burns |
| 5,502,333 A | 3/1996 | Bertin et al. |
| 5,514,907 A | 5/1996 | Moshayedi |
| 5,516,989 A * | 5/1996 | Uedo et al. ................. 174/254 |
| 5,523,619 A | 6/1996 | McAllister et al. |
| 5,523,695 A | 6/1996 | Lin |
| 5,541,812 A | 7/1996 | Burns |
| 5,543,664 A | 8/1996 | Burns |
| 5,561,591 A | 10/1996 | Burns |
| 5,566,051 A | 10/1996 | Burns |
| 5,572,065 A | 11/1996 | Burns |
| 5,588,205 A | 12/1996 | Roane |
| 5,592,364 A | 1/1997 | Roane |
| 5,594,275 A | 1/1997 | Kwon et al. |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. |
| 5,778,522 A | 7/1998 | Burns |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,828,125 A | 10/1998 | Burns |
| 5,835,988 A | 11/1998 | Ishii |
| 5,841,721 A | 11/1998 | Kwon et al. |
| 5,869,353 A | 2/1999 | Levy et al. |
| 5,895,970 A | 4/1999 | Miyoshi et al. |
| 5,899,705 A | 5/1999 | Akram |
| 5,917,709 A | 6/1999 | Johnson et al. |
| 5,922,061 A | 7/1999 | Robinson |
| 5,925,934 A | 7/1999 | Lim |
| 5,926,369 A | 7/1999 | Ingraham et al. |

| | | | | | | |
|---|---|---|---|---|---|---|
| 5,949,657 A | 9/1999 | Karabatsos | | 6,560,117 B2 | 5/2003 | Moon |
| 5,953,215 A | 9/1999 | Karabatsos | | 6,572,387 B2 | 6/2003 | Burns et al. |
| 5,959,839 A | 9/1999 | Gates | | 6,576,992 B1 | 6/2003 | Cady et al. |
| 5,963,427 A | 10/1999 | Bolleson | | 6,588,095 B2 | 7/2003 | Pan |
| 5,973,395 A | 10/1999 | Suzuki et al. | | 6,590,282 B1 | 7/2003 | Wang et al. |
| 5,995,370 A | 11/1999 | Nakamori | | 6,600,222 B1 | 7/2003 | Levardo |
| 6,002,167 A | 12/1999 | Hatano et al. | | 6,614,664 B2 | 9/2003 | Lee |
| 6,002,589 A | 12/1999 | Perino et al. | | 6,620,651 B2 | 9/2003 | He et al. |
| 6,014,316 A | 1/2000 | Eide | | 6,627,984 B2 | 9/2003 | Bruce et al. |
| 6,025,642 A | 2/2000 | Burns | | 6,657,134 B2 | 12/2003 | Spielberger et al. |
| 6,028,352 A | 2/2000 | Eide | | 6,660,561 B2 | 12/2003 | Forthun |
| 6,028,365 A | 2/2000 | Akram et al. | | 6,677,670 B2 | 1/2004 | Kondo |
| 6,034,878 A | 3/2000 | Osaka et al. | | 6,683,377 B1 | 1/2004 | Shim et al. |
| 6,040,624 A | 3/2000 | Chambers et al. | | 6,690,584 B2 | 2/2004 | Uzuka et al. |
| 6,072,233 A | 6/2000 | Corisis et al. | | 6,699,730 B2 | 3/2004 | Kim et al. |
| 6,084,293 A | 7/2000 | Ohuchi | | 6,707,684 B2 | 3/2004 | Andric et al. |
| 6,084,294 A | 7/2000 | Tomita | | 6,709,893 B2 | 3/2004 | Moden et al. |
| 6,097,087 A | 8/2000 | Farnworth et al. | | 6,768,660 B2 | 7/2004 | Kong et al. |
| 6,121,676 A | 9/2000 | Solberg | | 6,781,240 B2 | 8/2004 | Choi et al. |
| RE36,916 E | 10/2000 | Moshayedi | | 6,803,651 B1 | 10/2004 | Chiang |
| 6,157,541 A | 12/2000 | Hacke | | 6,812,567 B2 | 11/2004 | Kim et al. |
| 6,165,817 A | 12/2000 | Akram et al. | | 6,833,984 B1 | 12/2004 | Belgacem |
| 6,172,874 B1 | 1/2001 | Bartilson | | 6,849,949 B1 | 2/2005 | Lyu et al. |
| 6,178,093 B1 | 1/2001 | Bhatt et al. | | 6,876,074 B2 | 4/2005 | Kim |
| 6,187,652 B1 | 2/2001 | Chou et al. | | 6,884,653 B2 | 4/2005 | Larson |
| 6,205,654 B1 | 3/2001 | Burns | | 6,891,729 B2 | 5/2005 | Ko et al. |
| 6,208,521 B1 | 3/2001 | Nakatsuka | | 6,908,792 B2 | 6/2005 | Bruce et al. |
| 6,222,737 B1 | 4/2001 | Ross | | 6,914,324 B2 | 7/2005 | Rapport et al. |
| 6,225,688 B1 | 5/2001 | Kim et al. | | 6,919,626 B2 | 7/2005 | Burns |
| 6,233,650 B1 | 5/2001 | Johnson et al. | | 2001/0006252 A1 | 7/2001 | Kim et al. |
| 6,234,820 B1 | 5/2001 | Perino et al. | | 2001/0013423 A1 | 8/2001 | Dalal et al. |
| 6,262,476 B1 | 7/2001 | Vidal | | 2001/0015487 A1 | 8/2001 | Forthun |
| 6,262,895 B1 | 7/2001 | Forthun | | 2001/0035572 A1 | 11/2001 | Isaak |
| 6,265,660 B1 | 7/2001 | Tandy | | 2001/0040793 A1 | 11/2001 | Inaba |
| 6,266,252 B1 | 7/2001 | Karabatsos | | 2002/0006032 A1 | 1/2002 | Karabatsos |
| 6,281,577 B1 | 8/2001 | Oppermann et al. | | 2002/0030995 A1 | 3/2002 | Shoji |
| 6,285,560 B1 | 9/2001 | Lyne | | 2002/0048849 A1 | 4/2002 | Isaak |
| 6,288,907 B1 | 9/2001 | Burns | | 2002/0076919 A1 | 6/2002 | Peters et al. |
| 6,300,679 B1 | 10/2001 | Mukerji et al. | | 2002/0101261 A1 | 8/2002 | Karabatsos |
| 6,303,981 B1 | 10/2001 | Moden | | 2002/0139577 A1 | 10/2002 | Miller |
| 6,310,392 B1 | 10/2001 | Burns | | 2002/0164838 A1 | 11/2002 | Moon et al. |
| 6,313,998 B1 | 11/2001 | Kledzik | | 2002/0180022 A1 | 12/2002 | Emoto |
| 6,316,825 B1 | 11/2001 | Park et al. | | 2003/0016710 A1 | 1/2003 | Kamoto |
| 6,323,060 B1 | 11/2001 | Isaak | | 2003/0045025 A1 | 3/2003 | Coyle et al. |
| 6,329,708 B1 | 12/2001 | Komiyama | | 2003/0049886 A1 | 3/2003 | Salmon |
| 6,336,262 B1 | 1/2002 | Dalal et al. | | 2003/0081392 A1 | 5/2003 | Cady et al. |
| 6,351,029 B1 | 2/2002 | Isaak | | 2003/0107118 A1 | 6/2003 | Pflughaupt et al. |
| 6,360,433 B1 | 3/2002 | Ross | | 2003/0109078 A1 | 6/2003 | Takahashi et al. |
| 6,368,896 B2 | 4/2002 | Farnworth et al. | | 2003/0168725 A1 | 9/2003 | Warner et al. |
| 6,376,769 B1 | 4/2002 | Chung | | 2004/0000708 A1 | 1/2004 | Rapport et al. |
| 6,392,162 B1 | 5/2002 | Karabatsos | | 2004/0021211 A1 | 2/2004 | Damberg |
| 6,410,857 B1 | 6/2002 | Gonya | | 2004/0031972 A1 | 2/2004 | Pflughaupt et al. |
| 6,426,240 B2 | 7/2002 | Isaak | | 2004/0045159 A1 | 3/2004 | DiStefano et al. |
| 6,426,549 B1 | 7/2002 | Isaak | | 2004/0065963 A1 | 4/2004 | Karnezos |
| 6,426,560 B1 | 7/2002 | Kawamura et al. | | 2004/0075991 A1 | 4/2004 | Haba et al. |
| 6,433,418 B1 | 8/2002 | Fujisawa et al. | | 2004/0099938 A1 | 5/2004 | Kang et al. |
| 6,444,490 B2 | 9/2002 | Bertin et al. | | 2004/0104470 A1 | 6/2004 | Bang et al. |
| 6,444,921 B1 | 9/2002 | Wang et al. | | 2004/0115866 A1 | 6/2004 | Bang et al. |
| 6,446,158 B1 | 9/2002 | Karabatsos | | 2004/0150107 A1 | 8/2004 | Cha et al. |
| 6,449,159 B1 | 9/2002 | Haba | | 2004/0157352 A1 | 8/2004 | Beroz et al. |
| 6,452,826 B1 | 9/2002 | Kim et al. | | 2004/0203190 A1 | 10/2004 | Pflughaupt et al. |
| 6,462,412 B2 | 10/2002 | Kamei et al. | | 2004/0217461 A1 | 11/2004 | Damberg |
| 6,465,877 B1 | 10/2002 | Farnworth et al. | | 2004/0217471 A1 | 11/2004 | Haba |
| 6,465,893 B1 | 10/2002 | Khandros et al. | | 2004/0238931 A1 | 12/2004 | Haba et al. |
| 6,473,308 B2 | 10/2002 | Forthun | | 2004/0245617 A1 | 12/2004 | Damberg et al. |
| 6,486,544 B1 | 11/2002 | Hashimoto | | 2005/0018495 A1 | 1/2005 | Bhakta et al. |
| 6,489,178 B2 | 12/2002 | Coyle et al. | | 2005/0035440 A1 | 2/2005 | Mohammed |
| 6,489,687 B1 | 12/2002 | Hashimoto | | 2005/0040508 A1 | 2/2005 | Lee |
| 6,492,718 B2 | 12/2002 | Ohmori | | 2005/0133897 A1 | 6/2005 | Baek et al. |
| 6,509,639 B1 | 1/2003 | Lin | | | | |
| 6,514,793 B2 | 2/2003 | Isaak | | FOREIGN PATENT DOCUMENTS | | |
| 6,528,870 B2 | 3/2003 | Fukatsu et al. | | | | |
| 6,552,910 B1 | 4/2003 | Moon et al. | | DE | 004214102 A1 | 12/1992 |

| | | |
|---|---|---|
| EP | 0426-303 (A2) | 10/1990 |
| EP | 461-639(A) | 12/1991 |
| JP | 359088863 (A) | 5/1984 |
| JP | 60-254762 (A) | 12/1985 |
| JP | 3641047659 (A) | 3/1986 |
| JP | 62-230027 (A) | 8/1987 |
| JP | 4-209562 (A) | 7/1992 |
| JP | 404368167 (A) | 12/1992 |
| JP | 5029534 (A) | 2/1993 |
| JP | 63-153849 (A) | 6/1998 |
| JP | 2000/307029 (A) | 11/2000 |
| JP | 2001077294(A) | 3/2001 |
| JP | 2001085592(A) | 3/2001 |
| JP | 2001332683(A) | 11/2001 |
| JP | 2003037246(A) | 2/2003 |
| JP | 2003086760(A) | 3/2003 |
| JP | 2003086761(A) | 3/2003 |
| JP | 2003/309247 (A) | 10/2003 |
| JP | 2003309246(A) | 10/2003 |
| JP | 2003/347475 (A) | 12/2003 |
| JP | 2003/347503 (A) | 12/2003 |
| WO | WO 03/037053 A1 | 5/2003 |

OTHER PUBLICATIONS

Tessera Technologies, Inc.—Semiconductor Intellectual Property, Chip Scale Packaging—Website pp. (3), Published on Internet.
Tessera Introduces uZ ä—Ball Stacked Memory Package for Computing and Portable Electronic Products, Oyce Smaragdis, Tessera Public Relations, Sandy Skees, MCA PR (www.tessera.com/news_events/press_coverage.cfm); 2 figures that purport to be directed to the uZ ä-Ball Stacked Memory Package. Published Jul. 17, 2002, San Jose, CA.
Ron Bauer, Intel. "Stacked-CSP Delivers Flexibility, Reliability, and Space-Saving Capabilities", Spring 2002, Published on the Internet.
Tessera uZ Ball Stack package. 4 figures that purport to be directed to the uZ-Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Flexible Printed Circuit Technology—A Versatile Interconnection Option. (Website 2 pages) Fjelstad, Joseph. Dec. 3, 2002.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Intergrated Package, Alvin Weinberg, Pacesetter, Inc. and W. Kinzy Jones, Florida International University.
1992 Proceedings, 42nd Electronic Components & Technology Conference, May 18-20, 1992.
Research Disclosure, Organic Card Device Carrier, 31318, May 1990, No. 313.
IBM Technical Disclosure Bulletin, vol. 23, No. 12, May 1981.
IBM Technical Disclosure Bulletin, vol. 20, No. 11A, Apr. 1978.
IBM Technical Disclosure Bulletin, vol. 32, No. 3B, Aug. 1989.
Orthogonal Chip Mount—A 3D Hybrid Wafer Scale Integration Technology, International Electron Device Meeting, IEDM Technical Digest, Washington, D.C., Dec. 6-9, 1987.

* cited by examiner

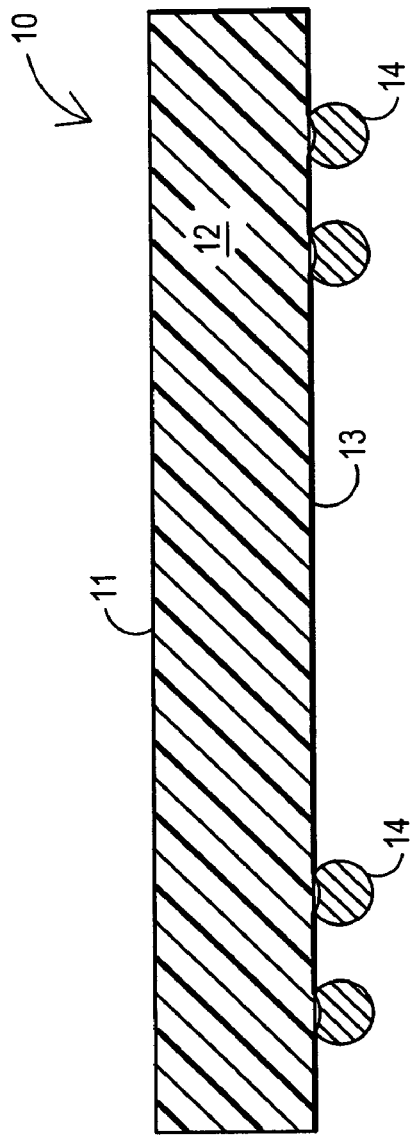
FIG. 1 - Prior Art
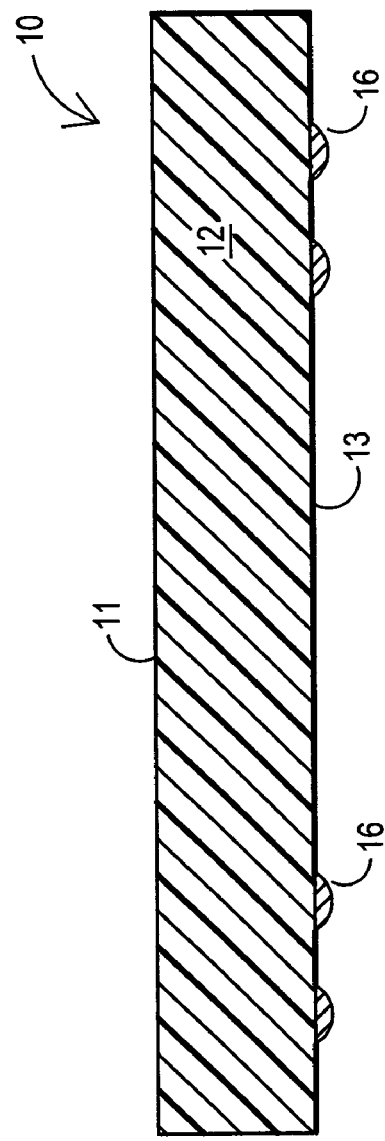
FIG. 2

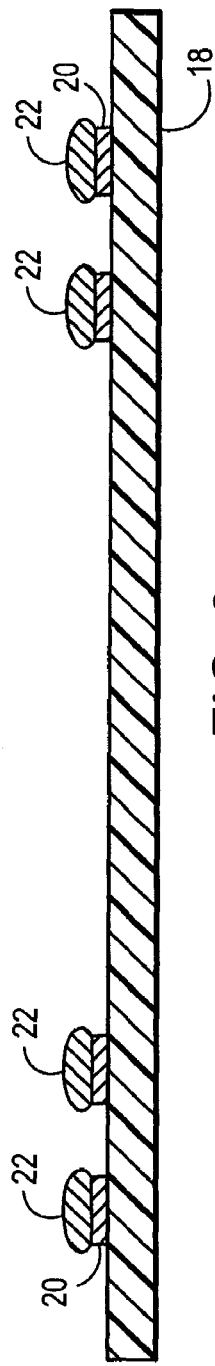
FIG. 3
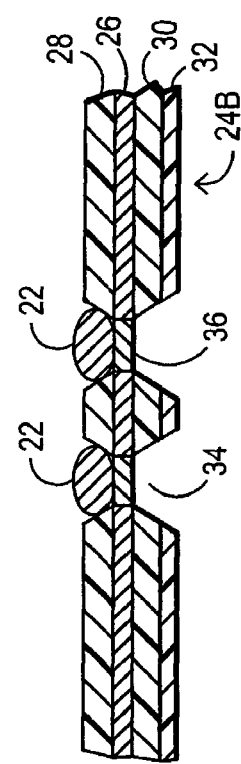
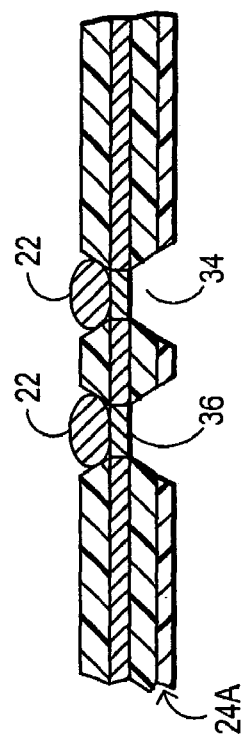
FIG. 4

LOW PROFILE STACKING SYSTEM AND METHOD

RELATED APPLICATIONS

The present application is a division of application Ser. No. 10/457,608. filed Jun. 9, 2003, which is a continuation-in-part of U.S. patent application Ser. No. 10/005,581, filed Oct. 26, 2001, now U.S. Pat. No. 6,576,992, all of which are herein incorporated by reference.

TECHNICAL FIELD

The present invention relates to mounting integrated circuit devices on substrates and to mounting integrated circuits on substrates employed in stacked modules.

BACKGROUND OF THE INVENTION

A variety of methods are used to mount integrated circuit devices to substrates such as PWBs and flex circuitry. Solder paste is selectively applied to the integrated circuit device or substrate to which the IC is to be attached. The device and substrate are exposed to reflow temperatures of approximately 220° C. The device is, consequently, soldered to the substrate.

Typically, however, the formed solder joints will re-melt during subsequent processing. Common tin-lead solders start to melt at 183° C. and, when exposed to such temperatures and higher, the exposed joint may re-melt and become unreliable.

What is needed, therefore, is a technique and system for mounting integrated circuit devices on substrates that provides an efficient and readily implemented technique to create structures that reliably withstand subsequent exposure to typical tin-lead solder melting point temperatures.

SUMMARY OF THE INVENTION

The present invention provides a system and method that mounts integrated circuit devices onto substrates and a system and method for employing the method in stacked modules. The contact pads of a packaged integrated circuit device are substantially exposed. A solder paste that includes higher temperature solder paste alloy is applied to a substrate or the contacts of the packaged device. The integrated circuit device is positioned to contact the contacts of the substrate with the higher temperature solder alloy paste between. Heat is applied to create high temperature joints between the contacts of the substrate and the integrated circuit device resulting in a device-substrate assembly with high temperature joints. The formed joints are less subject to re-melting in subsequent processing steps. The method may be employed in devising stacked module constructions such as those disclosed herein as preferred embodiments in accordance with the invention. Typically, the created joints are low in profile. In a method in accordance with the present invention, a first solder used to construct a stacked module has a higher melting point than a second solder used to populate a board with that module.

BRIEF DESCRIPTION OF THE DRAWINGS

FIG. 1 depicts a typical prior art packaged integrated circuit device.

FIG. 2 depicts the device of FIG. 1 from which the solder ball contacts have been removed.

FIG. 3 depicts a set of substrate contacts upon which a high temperature solder paste has been applied in accordance with a preferred embodiment of the present invention.

FIG. 4 depicts portions of two flexible circuit connectors prepared for mounting of an integrated circuit device in accordance with a preferred embodiment of the present invention.

DESCRIPTION OF PREFERRED EMBODIMENTS

Figure 5:
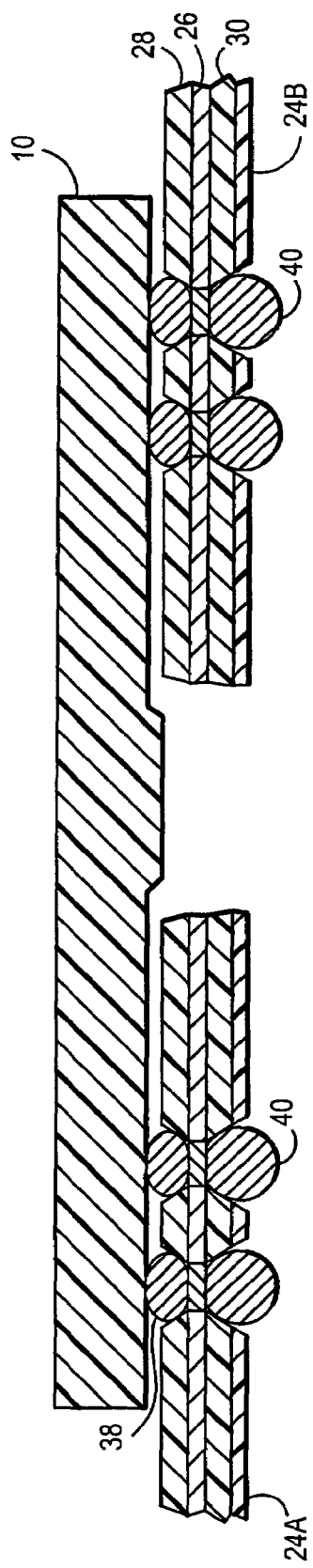
FIG. 5 depicts a device-substrate assembly in accordance with a preferred embodiment of the present invention.

FIG. 1 depicts an exemplar integrated circuit device 10 having upper surface 11 and lower surface 13. Device 10 is an example of one type of the general class of devices commonly known in the art as chip-scale-packaged integrated circuits ("CSPs"). The present invention may employed with a wide variety of integrated circuit devices and is not, as those of skill in the art will understand, limited to devices having the profile depicted in FIG. 1. Further, although its preferred use is with plastic-bodied CSP devices, the invention provides advantages in mounting a variety of packaged integrated circuit devices in a wide variety of configurations including leaded and CSP topologies.

Exemplar integrated circuit device 10 may include one or more integrated circuit die and body 12 and a set of contacts 14. The illustrated integrated circuit device 10 has CSP ball contacts 14 arrayed along surface 13 of its body 12. Typically, when integrated circuit device 10 is a CSP device, CSP ball contacts 14 are, as depicted, balls that are a mixture of tin and lead with a common relative composition of 63% tin and 37% lead. Such contacts typically have a melting point of about 183° C. Other contacts are sometimes found along a planar surface of integrated circuit devices and such other contacts may also be treated in accordance with the present invention where the opportunity arises as will be understood after gaining familiarity with the present disclosure.

In the depiction of FIG. 2, CSP ball contacts 14 have been removed, leaving CSP pads 16 arrayed along lower surface 13. CSP pads 16 will typically exhibit a residual thin layer of tin/lead mixture after removal of CSP ball contacts 14. As those of skill will know, CSPs may be received without attached balls and the process and structures described herein will then not require "removal" of balls. Further, embodiments of the present invention may be implemented with CSPs already bearing ball contacts comprised of high temperature solders.

FIG. 3 depicts exemplar substrate 18 on which are disposed contacts 20. Substrate 18 is depicted as a rigid board such as a PWB or PCB such as are known in the art. In accordance with a preferred embodiment of the present invention, a solder paste 22 is applied to substrate contacts 20. In accordance with an alternative preferred embodiment of the invention, solder paste 22 is applied to the CSP pads 16 and not the substrate contacts 20. However, as those of skill will recognize, solder paste 22 may applied to both substrate contacts 20 and CSP pads 16 (or a set of contacts of other configuration when devices that are not CSP are used in accordance with the invention.) As those of skill understand, solder paste is a mixture of solder particles and flux.

Two or more of the elements lead, tin, silver, copper, antimony or indium may be employed in a variety of combinations to devise a solder to be employed in solder paste 22 in accordance with the present invention. Therefore, in accordance with preferred embodiments of the present invention, a solder alloy employed in solder paste 22 exhibits a melting point equal to or greater than 235° C. and, preferably between 235° C. and 312° C. The alloy chosen should not have a melting point so high that the IC package is adversely affected, but it should also not be so low as to remelt during board assembly operations.

Some market participants are starting to implement lead-free solders. Such lead-free solders will typically have melting points higher than those found in lead inclusive solders. Typically, those who use lead-free solders to populate boards with stacked modules will, for example, employ temperatures up to 240° C. in the process of attachment of stacked modules to boards. Consequently, a HT joint implemented with a lead-free alloy will, in conformity with preferred embodiments of the present invention, exhibit a melting point greater than those lead-free solders used to populate boards. Consequently, a preferred implementation of the HT joints of the present invention will have a melting point range of between 245° C. and 265° C. The lead-free solder alloy employed in such HT joints will be comprised of at least two of the following elements: tin, silver, copper, or indium.

Preferably, an alloy used as a solder in the present invention will melt over a narrow temperature range. Disintegration of the module during board attachment or population will be less likely if the melt range is narrow. Most preferably, the top of the melting point range of the solder used in board attachment should be exceeded by 15° C. by the melting point of the solder used to manufacture the stacked module although in the case of lead-free solders, this is reduced to ameliorate issues that could arise from exposure of the package to high temperatures.

The following combinations have been found to exhibit the following melting points, and the below recited combinations are merely a representative, but not exhaustive, list of examples of solder alloys appropriate for use in the present invention. As those of skill will recognize, these examples are instructive in selecting other preferred particular combinations of lead, tin, silver, copper, antimony, and indium that are readily employed to advantage in the present invention so as to arrive at alloys of at least two of the following solder elements: lead, tin, silver, copper, antimony, and indium that have in their combined mixture, a preferred melting point between 235° C. to 312° C. inclusive.

a. A combination of 95% Sn and 5% Sb melts over a range of 235° C. to 240° C.

b. A combination of 83% Pb and 10% Sb and 5% Sn and 2% Ag melts over a range of 237° C. to 247° C.

c. A combination of 85% Pb and 10% Sb and 5% Sn melts over a range of 245° C. to 255° C.

d. A combination of 90% Pb and 10% Sb melts over a range of 252° C. to 260° C.

e. A combination of 92.5% Pb, 5% Sn and 2.5% Ag melts over a range of 287° C. to 296° C.

f. A combination of 90% Pb and 10% Sn melts over a range of 275° C. to 302° C.

g. A combination of 95% Pb and 5% Sn melts over a range of 308° C. to 312° C.

h. A combination of 75% Pb and 25% Indium melts over a range of. 240° C. to 260° C.

Those of skill will note that solder alloys or mixtures may also be employed in embodiments of the present invention that exhibit melting points lower than 235° C., as would be exhibited for example with a 97% Sn and a 3% Sb alloy, but preferred embodiments will employ solder mixtures or alloys that melt between 235° C. and 312° C. inclusive.

FIG. 4 depicts portions of two flexible circuit connectors 24A and 24B prepared for mounting of a device 10 in accordance with a preferred embodiment of the present invention. Exemplar flex circuits 24A and 24B may be simple flex circuitry or may exhibit the more sophisticated designs of flex circuitry such as those that would be constructed in accordance with the detailed descriptions provided in U.S. patent application Ser. No. 10/005,581 which has been made part of this application by incorporation by reference. For clarity of exposition, depicted flex circuits 24A and 24B exhibit a single conductive layer 26 and a first outer layer 28. Conductive layer 26 is supported by substrate layer 30, which, in a preferred embodiment, is a polyimide. Outer layer 32 resides along the lower surface of the flex circuits 24A and 24B. Optional outer layers 28 and 32, when present, are typically a covercoat or solder mask material. Windows 34 are created through outer layer 32 and intermediate layer 30 to expose flex contacts 36.

As depicted in FIG. 4, solder paste 22 is applied to flex contacts 36 which are demarked at the level of conductive layer 26. Solder paste 22 may also alternatively or in addition, be applied to the CSP pads 16 of a CSP. Windows 34 provide openings through which module contacts may be disposed in a later stacked module assembly step. Those of skill will recognize that the method of the present invention is applicable to a wide variety of substrates including solid PWB's, rigid flex, and flexible substrates such as flexible circuits, for example, and the substrate employed can be prepared in accordance with the present invention in a manner appropriate for the intended application. Where the invention is employed with rigid substrates such as a PWB, multilayer strategies and windowing in substrate layers are techniques which are useful in conjunction with the present invention, but not essential.

FIG. 5 depicts a device-substrate assembly in accordance with a preferred embodiment of the present invention as may be employed in the construction of a low profile stacked module. The features depicted in FIG. 5 are not drawn to scale, and show various features in an enlarged aspect for purposes of illustration. As shown, integrated circuit device 10 is disposed upon flex circuits 24A and 24B which have been, in a preferred embodiment of the method of the present invention, previously prepared as shown in earlier FIG. 4. Module contacts 40 have been appended to flex circuits 24A and 24B to provide connective facility for the device-flex combination whether as part of a stacked module or otherwise.

High temperature joint contacts 38 ("HT joints") are formed by the melting of the lead alloy in previously applied solder paste 22 and the application of a selected heat range appropriate for the solder mixtures identified previously. Thus, HT joints 38 will, after solidification, typically not re-melt unless exposed subsequently to such temperature ranges. The temperature range applied in this step of assembly will not typically be subsequently encountered in a later assembly operation such as, for example, the application of a stacked module to a DIMM board. Consequently, in one embodiment, the present invention is articulated as a stacked module having HT joints that is appended to a DIMM board with traditional lower melting point solder.

Figure 6:
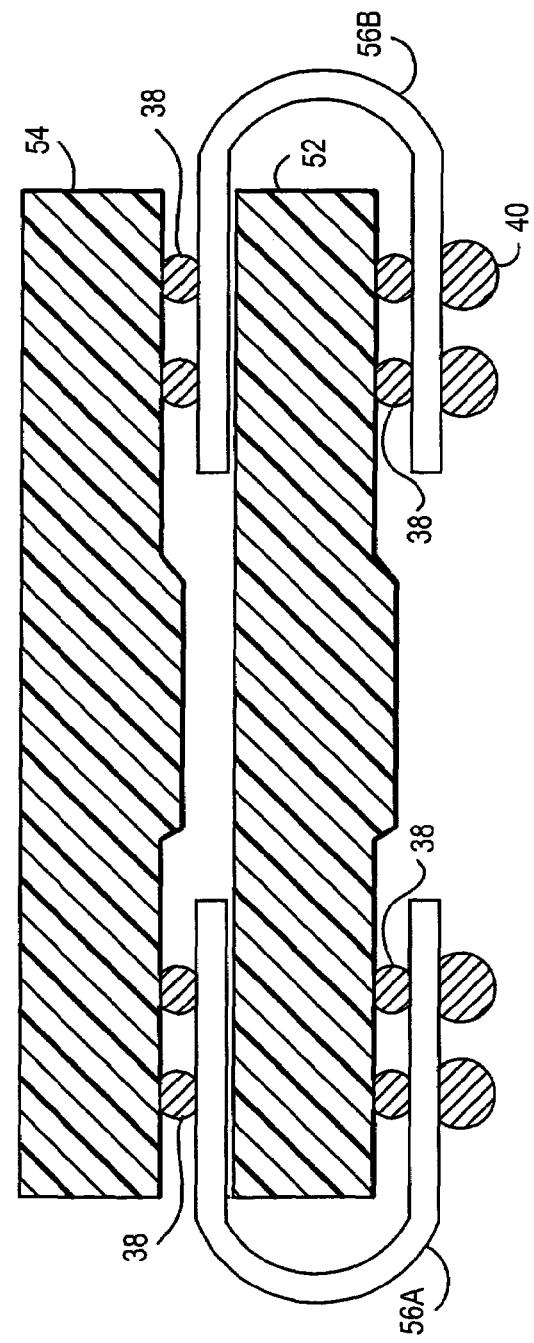
FIG. 6 depicts a two-high integrated circuit module mounted to the two flexible circuit connectors depicted in FIG. 4 in accordance with a preferred embodiment of the present invention.

FIG. 6 depicts a two-high stacked module devised in accordance with a preferred embodiment of the present invention. Stacked module 50 shown in FIG. 6 includes lower integrated circuit device 52 and upper integrated circuit device 54. A stacked module 50 may be devised in accordance with the present invention that includes more than two packaged integrated circuit devices. Flex circuits 56A and 56B are depicted connecting lower integrated circuit device 52 and upper integrated circuit device 54. Those of skill will also recognize that module 50 may be implemented with a single flexible circuit connector. Further, the flexible circuit connectors employed in accordance with the invention may exhibit one or more conductive layers. Flex circuits 56A and 56B may be any circuit connector structure that provides connective facility between two integrated circuits having a contact array. Those of skill will note that flexible circuits 56A and 56B may exhibit single conductive layers (such as, for example, the flexible circuit connectors earlier illustrated herein and identified for descriptive purposes as flex circuits 24A and 24B in FIG. 5) or may exhibit multiple conductive layers. Examples of other preferred flexible circuit structures are found in U.S. application Ser. No. 10/005,581 which has been incorporated by reference and those of skill will readily appreciate how a variety of circuit structures may be employed in preferred embodiments. Further, the connective structures used to connect lower integrated circuit 52 with upper integrated circuit 54 need not literally be flexible circuit connectors but may be flexible in portions and rigid in other portions.

HT contacts 38 are employed in the preferred embodiment of FIG. 6 to provide connective facility between the respective integrated circuits and contacts borne by the flex circuits 56A and 56B. Preferably, HT joints 38 will exhibit a height dimension smaller than that of CSP ball contacts 14 shown earlier as part of typical CSPs in FIG. 1. As those of skill will recognize, HT joints 38 are depicted in a scale that is enlarged relative to joint sizes that would typically be encountered in actual practice of preferred modes of the invention. Thus, module 50 will preferably present a lower profile than stacked modules created employing typical CSP contacts 14 on each of the constituent integrated circuit packages employed in a stacked module 50.

Figure 7:
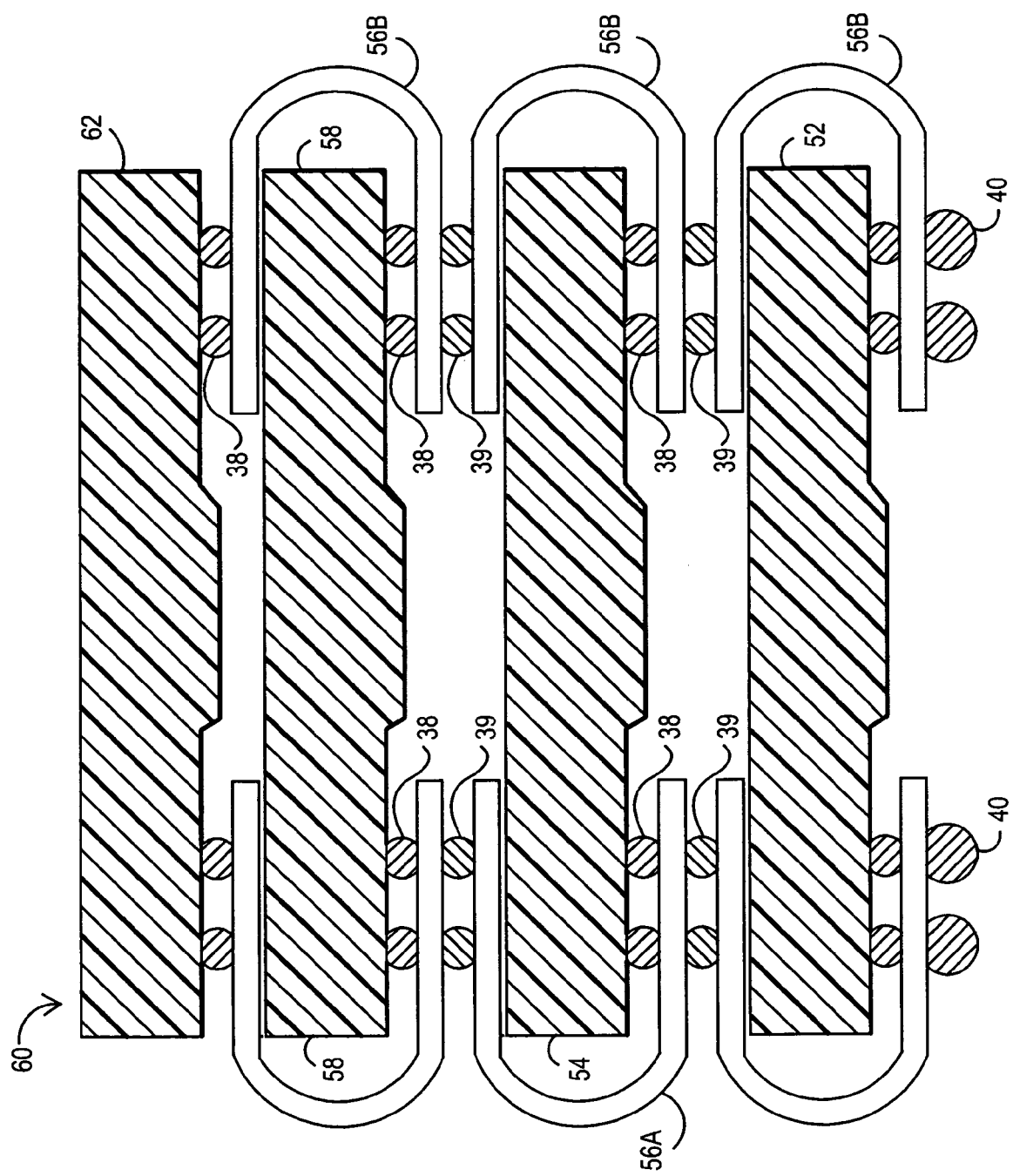
FIG. 7 depicts a four-high stacked module devised in accordance with a preferred embodiment of the present invention.

FIG. 7 depicts module 60 as having lower integrated circuit element 52, upper IC element 54, $3^{rd}$ IC element 58, and $4^{th}$ IC element 62. When the present invention is employed between flex circuits in stacking multiple levels of CSPs, as for example in FIG. 7, some embodiments will present HT contacts that have minimal heights that do not cause appreciable separation between the flex circuitry associated IC 52 and IC 54, for example, or between IC 54 and IC 62, for example. For such embodiments, the apparent height for illustrated HT joints 39, particularly, that lie between respective layers of flex circuitry will be understood to be exaggerated in the depiction of FIG. 7. Three sets of flex circuitry pairs 56A and 56B are also shown but, as in other embodiments, the invention may be implemented with a variety of substrates including single flex circuits in place of the depicted pair and with flexible circuits that have one or plural conductive layers.

As shown, the HT joints provide connections between integrated circuit devices and substrates and the overall profile of module 60 is reduced by use of the present invention that provides advantages in subsequent processing steps such as, for example, affixation of module 60 to DIMM boards, for example.

To construct a stacked module in accordance with a preferred embodiment of the present invention, if present, ball contacts 14 are removed from a CSP leaving CSP contacts 16 that typically exhibit a residual layer of solder. A high temperature solder paste composed from a lead alloy or mixture that has a preferable melting point equal to or higher than 235° C. and preferably less than 312° C. is applied to substrate contacts 20 of a substrate such as a flexible circuit and/or the substrate contacts to which it is to be mounted. The CSP is positioned to place the CSP pads 16 and substrate contacts 22 in appropriate proximity. Heat is applied sufficient to melt the lead solder alloy of solder paste 22 thus forming HT joints 38. The flexible circuit is positioned to place portions of the flexible circuit connector between the first CSP and a second CSP that is connected to the substrate with HT joints created using the process described for creating HT joints.

In understanding the present invention, it may be helpful to articulate the relative melting points in terms of variables to illustrate the relationships between the HT joints used to construct a stacked module and the solders used to populate a board with such a HT joint-implemented stacked module. In use in board population, the present invention will provide a stacked high module that is assembled using the HT joints that exhibit melting point ranges between X and Y degrees where X is less than Y. Attachment of the stacked module to a board is then implemented with a solder having a melting point between A and B degrees where A and B are less than X.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A stacked circuit module comprising:
  a first integrated circuit;
  a second integrated circuit disposed above the first integrated circuit;
  a flex circuit connecting the first and second integrated circuits, the first integrated circuit and the second integrated circuit being connected to the flex circuit through a high temperature joint comprising an alloy comprised of lead, the alloy having a melting point between 237° C. and 312° C., and the flex circuit comprising:
  first and second outer layers;
  first and second conductive layers, between which there is an intermediate layer, the first and second conductive layers and the intermediate layer being interior to the first and second outer layers, the second conductive layer having demarked first and second flex contacts, the first flex contacts being accessible through first windows through the second outer layer and the second flex contacts being accessible through second windows through the first outer layer, the first conductive layer, and the intermediate layer.

2. The stacked circuit module of claim 1 in which the second flex contacts are accessible through module windows through the second outer layer.

3. The stacked circuit module of claim 1 in which the first and second conductive layers are metal.

4. The stacked circuit module flex circuit of claim 3 in which the metal of the first and second conductive layers is alloy 110.

5. The stacked circuit module of claim 1 in which selected ones of the first flex contacts are connected to selected ones of the second flex contacts.

6. The flex circuit of claim 5 in which the connected selected ones of the first and second flex contacts are connected with traces.

7. The stacked circuit module of claim 1 in which selected ones of the first flex contacts are connected to the first conductive layer.

8. The flex circuit of claim 1 in which selected ones of the first flex contacts and selected ones of the second flex contacts are connected to the first conductive layer with vias.

9. The flex circuit of claim 8 in which selected ones of the first flex contacts are connected to the first conductive layer with on-pad vias.

10. The flex circuit of claim 8 in which selected ones of the second flex contacts are connected to the first conductive layer with off-pad vias.

* * * * *